United States Patent
Le et al.

(10) Patent No.: US 8,896,251 B2
(45) Date of Patent: Nov. 25, 2014

(54) SELF-DIAGNOSTICS WITHIN POWER ELECTRONICS

(71) Applicants: Dong Le, Lakewood, CA (US); Liping Zheng, Buena Park, CA (US)

(72) Inventors: Dong Le, Lakewood, CA (US); Liping Zheng, Buena Park, CA (US)

(73) Assignee: Calnetix Technologies, LLC, Cerritos, CA (US)

( * ) Notice: Subject to any disclaimer, the term of this patent is extended or adjusted under 35 U.S.C. 154(b) by 206 days.

(21) Appl. No.: 13/663,354

(22) Filed: Oct. 29, 2012

(65) Prior Publication Data
US 2014/0117910 A1 May 1, 2014

(51) Int. Cl.
*G01R 31/02* (2006.01)

(52) U.S. Cl.
USPC ............................ 318/490; 318/569; 318/600

(58) Field of Classification Search
USPC .......... 318/490, 600, 567, 569, 504; 356/148, 356/189.08
See application file for complete search history.

(56) References Cited

U.S. PATENT DOCUMENTS

2005/0024956 A1* 2/2005 Tran et al. ..................... 365/200

* cited by examiner

*Primary Examiner* — Karen Masih
(74) *Attorney, Agent, or Firm* — Fish & Richardson P.C.

(57) ABSTRACT

This disclosure relates to diagnosing a power electronic device by itself and extending the diagnostics to an electric machine coupled with the power electronic device and deployed at an operational site. The power electronic device can power and control the electric machine. The diagnostics can include testing the status of the power electronic device, and monitoring hardware changes in the electric machine. The diagnostics can be performed within the power electronic device on demand, periodically, or both. In some instances, the self-diagnostics can evaluate whether components are defective or wired incorrectly, characterized by wrong inductance, and/or resistance, for example. In some implementations, the power electronic device includes a digital signal processing unit for the self-diagnostics and a data record system for recording and troubleshooting errors related to load performance and/or parameters.

22 Claims, 6 Drawing Sheets

SELF-DIAGNOSTICS WITHIN POWER ELECTRONICS

TECHNICAL FIELD

This disclosure relates to monitoring and controlling electric machines, and, more particularly, to monitoring and controlling electric motors or generators.

BACKGROUND

Electric machines (e.g., motors, generators, or the like) are often powered and controlled by power electronic (PE) devices. High power or high current PE devices require stringent tests to prevent failure that can cause severe damage. The failure can occur at switching devices including drivers in the PE devices. The switching devices and drivers can be tested during installation or at service. In addition, the electric machines coupled with PE devices can change in performance over time, due to component wear or aging. Early detection of the performance change can enable timely service to both the electric machines and the PE devices to reduce system downtime.

SUMMARY

A power electronic device can be electrically coupled to an electric machine installed at an operational site. The power electronic device can include a digital signal processing unit that is configured to determine the status of the power electronic device as well as the electric machine. In a general aspect, the DSP unit can power a logic section of the power electronic device. An initial set of communication logic signals in the logic section is verified to be zero. An initial set of gate signals is verified at a first predetermined level. The initial set of gate signals are measured at an output of a gate driver board. In response to the verification that the initial set of communication logic signals is zero and the initial set of gate signals is at the first predetermined level, a number of electronic switches are activated in a predetermined sequence to update the initial set of communication logic signals to a second set of communication logic signals in the DSP unit of the power electronic device. A voltage waveform is detected at the output of the gate driver board. A status of the power electronic device is determined by comparing the voltage waveform against a reference voltage waveform.

In some embodiments, the predetermined sequence includes a step function that includes a single pulse. The detected voltage waveform can include a corresponding step function that includes a single pulse. The corresponding step function matches the reference voltage waveform for determining the status of the power electronic device being operational. In some embodiments, the predetermined sequence includes a second step function that includes two pulses. The waveform in correspondence to the predetermined sequence can identify changes in electronic component parameters of the power electronic device.

The power electronic device may further include additional components. A capacitor bank for stably storing a direct current power source can be included. A pre-charge section can be used to connect to a power grid via a fuse. The pre-charge section can charge the capacitor bank using power from the power grid. A front end active rectifier can be used for converting an alternating current power source (e.g., from the power grid) to a direct current power source. An electric machine inverter can be used for converting the direct current power source to an alternating current power source. The power electronic device can further include at least one of a grid side reactor for improving total harmonic distortion, and a machine side reactor for improving total harmonic distortion. The front end active rectifier can be connected with the electric machine that produces alternating current power and converting the alternating current power to a direct current power. The electric machine inverter uses the direct current power source in the capacitor bank to power the electric machine with alternating current.

In certain instances of the embodiments, the power electronic device further includes a DSP unit configured to detect a current waveform at the output of the gate driver board. The DSP unit can determine a status of the power electronic device by comparing the current waveform against a reference current waveform. The current waveform includes at least two current signals of inductors connected to the electric machine. The at least two current signals comply with Kirchhoff current law. The current waveform contradicting to the at least two current signals complying with Kirchhoff current law would indicate a fault in the power electronic device.

DESCRIPTION OF DRAWINGS

Like reference symbols in the various drawings indicate like elements.

DETAILED DESCRIPTION

This disclosure relates to diagnosing a power electronic device by itself and extending the diagnostics to an electric machine coupled with the power electronic device and deployed at an operational site. The power electronic device can power and control the electric machine. The diagnostics can include testing the status of the power electronic device, and monitoring hardware changes in the electric machine. The diagnostics can be performed within the power electronic device on demand, periodically, or both. In some instances, the self-diagnostics can evaluate whether components are defective or wired incorrectly, characterized by wrong inductance, and/or resistance, for example. In some implementations, the power electronic device includes a digital signal processing (DSP) unit for the self-diagnostics and a data record system (DRS) for recording and troubleshooting errors related to load performance and/or parameters.

Self-diagnostics within the power electronic device has several advantages. For example, the self-diagnostics can be performed on demand or periodically, such as upon deployment/installation, at regular field service, or monitored continuously. The data generated from the self-diagnostics can be saved or streamed for reporting, archiving, or monitoring purposes. The self-diagnostics also avoids external equipment (e.g., external signal generator or drivers) or human intervention for the same purposes. The power electronic device or the associated electric machine can be saved from being removed for testing at a specific test bench. The self-diagnostics enables remote access to the testing procedure, allowing the power electronic device and/or the associated electric machine to be diagnosed from afar or locally.

Figure 1:
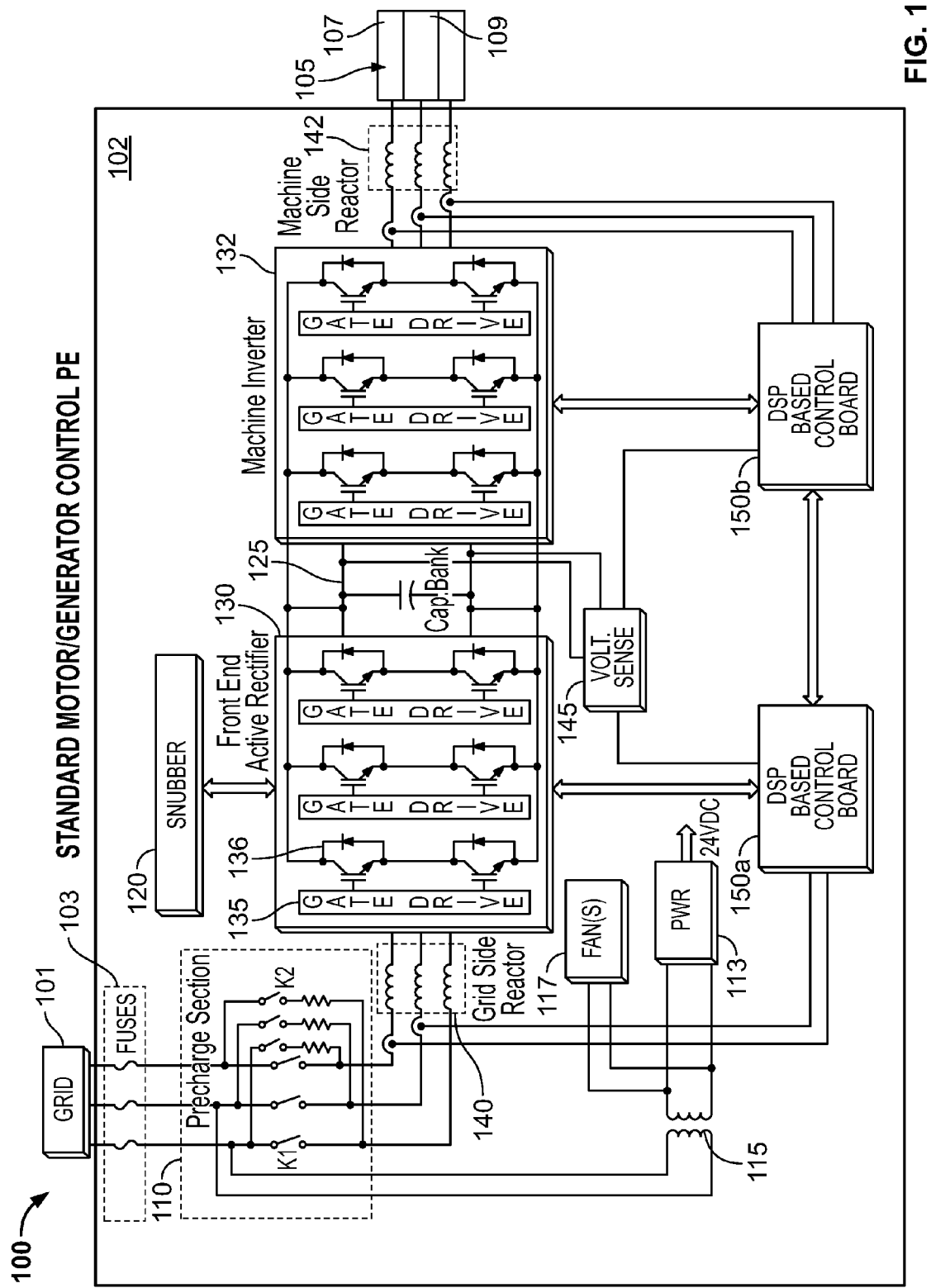
FIG. 1 is an example circuit diagram of a power electronic device in accordance with the present disclosure for coupling to an electric machine installed in an operational site.

FIG. 1 is an example circuit diagram 100 of a power electronic device 102 in accordance with the present disclosure for coupling to an electric machine 105 installed in an operational site. Although the power electronic device 102 and the electric machine 105 are illustrated as separate units in FIG. 1, it should be understood that in some implementations the power electronic device 102 can be integrated with, or a component in, the electric machine 105. The power electronic device 102 connects the electric machine 105 to a power grid 101. The electric machine 105 can operate to convert mechanical movement into electrical power, convert electrical power into mechanical movement, or both. The electric machine 105 usually includes a rotor 109 and a stator 107 for electro-magnetic interaction; for example, actuating the rotor 109 made of conductive materials in a magnetic field of the stator 107 to generate electrical current to send to the power grid 101, or supplying electrical power from the power grid 101 to the stator 107 to actuate the rotor 109.

The power electronic device 102 includes various systems and subsystems to power and control the operation of the electric machine 105. For example, the power electronic device 102 includes a pre-charge section 110, a capacitor bank 125, a front end active rectifier 130, a machine inverter 132, and a couple of digital signal processing (DSP) control boards 150a and 150b. At a high level, when the electric machine 105 is a motor, power flows from the power grid 101 via fuses 103 to the pre-charge section 110. The fuses 103 protect the power electronic device 102 from abnormally high current that may cause damage to the power electronic device 102. The alternating current (AC) power from the power grid 101 is received at the front end active rectifier 130 and is rectified into direct current (DC) power. The DC power is stored or cached at the capacitor bank 125 and further converted to AC power at the machine inverter 132. The converted AC power is then sent to power the electric machine 105.

The pre-charge section 110 can have a number of resistors for damping inrush electric current through the front end active rectifier 130 for charging the capacitor bank 125 when the power electronic device 102 initially powers up. The capacitor bank 125 includes high capacity capacitors as a DC power storage and stabilization center for the electric machine 105. For example, the capacitor bank 125 can quickly (e.g., at high current) charge and discharge DC power from the front end active rectifier 130 to the machine inverter 132, respectively. The front end active rectifier 130 can be any appropriate rectifier adopting various forms, such as pulse width modulation based MOSFET switches or IGBT switches, silicon-controlled rectifiers, and other silicon-based semiconductor switches. In some implementations, a grid side reactor 140 may be added between the pre-charge section 110 and the front end active rectifier 130 to improve total harmonic distortion. The grid side reactor 140 may include a number of filter inductors. In some implementations, a snubber 120 may be added to connect with the front end active rectifier 130 for providing an inductive load and alternative current path to allow the front end active rectifier 130 to discharge more safely and quietly.

The machine inverter 132 can be any appropriate inverter for changing the DC power in the capacitor bank 125 to AC power usable in the electric machine 105 using transformers, switching circuits, and/or control circuits. In some implementations, a machine side reactor 142 may be added between the machine inverter 132 and the electric machine 105 for improving total harmonic distortion. The machine side reactor 142 and the grid side reactor 140 may be similar or identical, including a number of filter inductors. The front end active rectifier 130 and the machine inverter 132 can include one or more gate drivers 135 and the related switches 136. The switches 136 can employ various types of transistors, such as metal oxide semiconductor field-effect transistor (MOSFET), insulated-gate bipolar transistor (IGBT), and other types of transistors. The front end active rectifier 130 and the machine inverter 132 can be respectively connected with a first DSP control board 150a and a second DSP control board 150b.

The DSP control boards 150a and 150b can control (e.g., providing input and monitor operations) the front end active rectifier 130, the machine inverter 132, and other related subsystems or components. For example, the DSP control board 150a can access the gate drives 135 of the front end active rectifier 130 and send control signals for activation/operation. The DSP control board 150a can further be connected with a voltage sensor 145 that is electrically coupled with the capacitor bank 125. The voltage sensor 145 measures the voltage of the capacitor bank 125 and sends the measurement to the DSP control board 150a as a monitoring or feedback signal. The DSP control board 150b can be substantially similar to the DSP control board 150a but tailored to control and monitor the machine inverter 132. In some implementations, the DSP control boards 150a and 150b may use DC power adapted from a power source 113 that produces 24V DC power (or other DC power suitable for the control boards). The voltage of the input power to the power source 113 can be transformed from the voltage of the power grid 101 by a transformer 115. The power output from the transformer 115 may be used by one or more fans 117 for cooling the power electric device 102 or any particular component or subsystem within the power electric device 102.

During operation, the DSP control boards 150a and 150b use the power from the pre-charge section 110 for powering a logic section therein. An initial set of communication logic signals in the logic section is then verified to be zero (e.g., without inducted current from previous operations). An initial set of gate signals of the front end active rectifier 130 and the machine inverter 132 is then verified to be at a predetermined value, such as 15 V. The initial set of gate signals may be measured at the output of one or more driver boards 135 of the front end active rectifier 130 and the machine inverter 132. These verifications confirm the initial state of the DSP control boards 150a and 150b. One or more electronic switches 136 associated with the driver boards 135 can then be turned on based on a predetermined sequence to update the initial set of communication logic signals to a new set of signals that can be detected as a voltage waveform at the output of the gate driver board 135. The output is sent to the DSP control boards 150a and 150b for analyzing the status of the power electronic device 102. The DSP control boards 150a and 150b compares the output waveform against a reference waveform to determine if any part or parameter of the circuit has changed. For example, the reference waveform may be the first output waveform when the analysis test is performed. The reference waveform may also be an average waveform of other power electronic devices of the same model. A difference between the detected waveform and the reference waveform larger than a predefined error range can indicate certain errors in the switches or circuits of the power electronic device 102.

The waveform comparison allows for monitoring the parameter changes caused by aging, malfunction, wear, or other operational reasons in the power electronic device 102. In some implementations, other output signals (e.g., current) may be used for other examination purposes. For example, a longer pulse signal may be provided to the circuits for measuring currents and examine the sum of the currents for detecting a fault due to potential ground leakage. A test routine may be setup in the firmware of the DSP controllers 150a and 150b to conduct the aforementioned functions. The firmware can be implemented in the DSP controllers 150a and 150b to generate gate switching pulse patterns and compare the record of the waveforms against gate switching patterns. Various gate switching pulse patterns may be generated to test the behavior of the electric machine 105 as well. The firmware may further be utilized by any remote controllers or applications for remote analyses.

Specific examples of tests can further include examining the status of the front end active rectifier 130 and the machine inverter 132 using a double pulse test by testing the three-phase inverter bridge as well as the electric machine 105 (e.g., motor or generator). The double pulse test can be used to measure the turn-on and turn-off characteristics of the front end active rectifier 130 and the machine inverter 132 under various levels of voltage and current. For example, the power electric device 102 can be powered on with an inductive load. The current rises until the device 102 is shut off for testing turn-off characteristics under load. The current within the device 102 can then circulate in the fly back diode. After a delay, the device 102 is turned back on for testing turn-on characteristics under load. After certain delay the device 102 is again shut off. Given a known inductive load and bus voltage, the test current levels can be varied by the on and off delays. Three inverter sensors may be shorted in the leg in the circuit for conducting the test. Because the ratio of the inductor current change is equal to the voltage divided by the inductor value, a required time can be set for reaching the desired current level for the second pulse to perform the on/off switching characteristic test. Similarly, the test can be applied to the electric machine 105 (e.g., a motor or generator). By implementing the test capabilities into the DSP control boards 150a and 150b, external signal generator and drivers can be avoided. Similar tests can be performed in the power electronic system without the device 102 being removed to a specific test bench.

Figure 2:
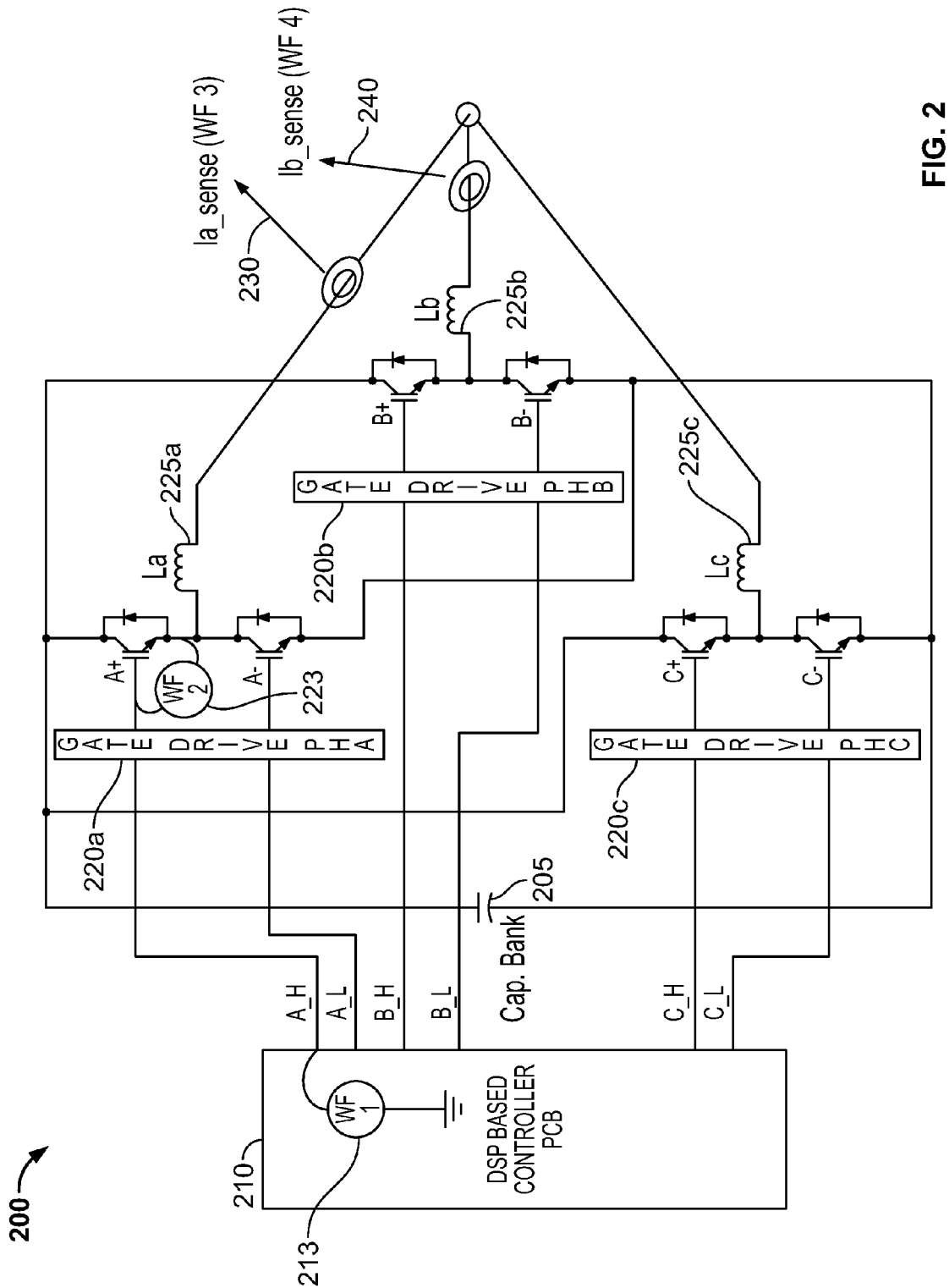
FIG. 2 is an example circuit diagram of a simplified instance for performing diagnostic tests in accordance with the present disclosure.

FIG. 2 is an example circuit diagram 200 of a simplified instance for performing diagnostic tests in accordance with the present disclosure. The example circuit diagram 200 may be considered as a simplified diagram of diagram 100 illustrated in FIG. 1. The circuit diagram 200 includes a single DSP control board 210, a capacitor bank 205, three gate drives 220a, 220b, and 220c, and three inductors 225a, 225b, and 225c. The capacitor bank 205 provides power to the three gate drives 220a, 220b, and 220c. The DSP control board 210 can output control signals to and monitor feedbacks from the three gate drives 220a, 220b, and 220c. The DSP control board 100 can at least perform a single pulse test, a double pulse test, or other tests with variable current or voltage input.

In a single pulse test, the capacitor bank 205 is completely discharged or initialized at zero bus voltage. A general procedure can include checking for correct wiring from the DSP control board 210 to the gate driver boards (e.g., the gate drives 220a, 220b, and 220c), and from the gate driver boards to each switch transistors (e.g., IGBT). Correct responses of the gate driver boards to various commands from the DSP controller board 210 is then verified. In general, the initiation of the single pulse test may be set by inputting one variable "xx" into command register. Then a series of command register numbers can be written to each switch transistor. For example, the gate drive 220a includes two transistors A+ and A−. Command register number 20 can be written for A+, and 17 can be written for A−. The gate drive 220b includes two transistors B+ and B−. Command register number 21 can be written for B+ and 18 for B−. The gate drive 220c includes two transistors C+ and C−. Command register number 22 can be written for C+ and 19 for C−. After these command register numbers are set, the logic section of the DSP controller 210 can then be powered up.

Figure 3:
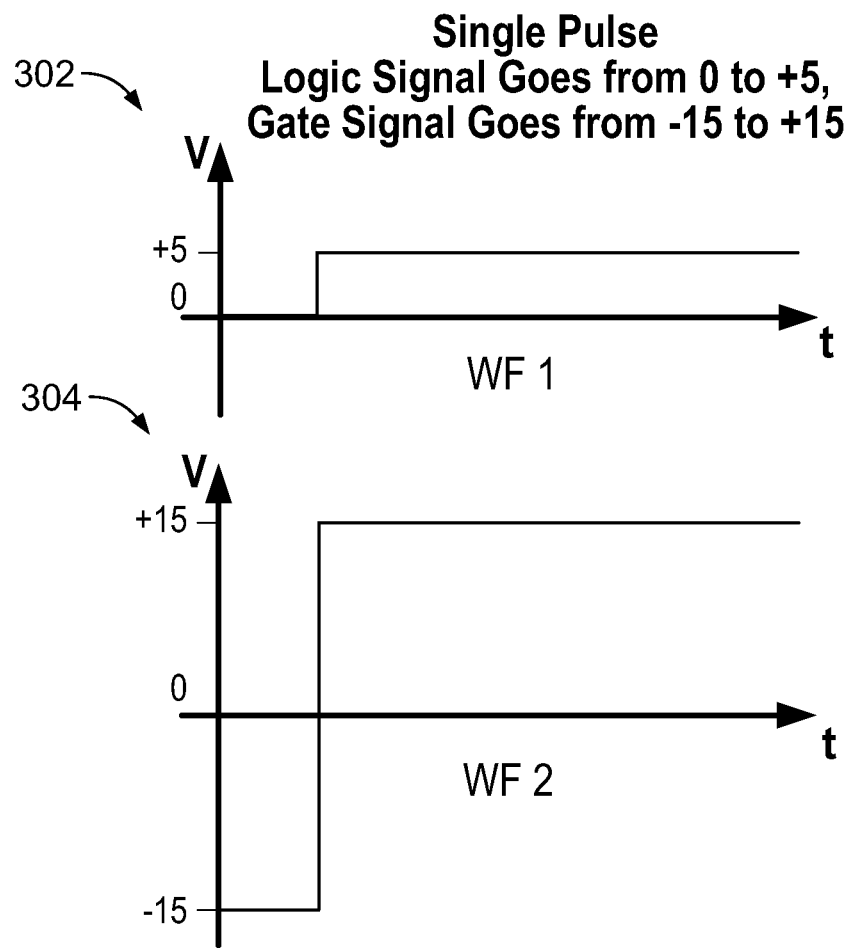
FIG. 3 illustrates an example single pulse test with input and output waveforms.

In the DSP controller 210, communication logic signals are verified to be zero at the initiation. On the gate driver board side (e.g., the three gate drives 220a, 220b, and 220c), gate signals are at −15 V or other predetermined default voltage. As these initial conditions are verified, the DSP control board 210 commands the gate drives 220a, 220b, and 220c to turn on each switch transistors in turn. The output of the gate drives 220a, 220b, and 220c are measured and compared against a reference or standard signal. An example reference signal is presented in FIG. 3. FIG. 3 illustrates an example single pulse test with an input waveform 302 and an output waveform 304. The input waveform 302 is the waveform at 213 of FIG. 2, sent from the DSP control board 210 to the gate drive 220a. The input waveform 302 is a single pulse waveform having one step function rose from 0 to 5 V. The output waveform 304 is measured at the A+ switch transistor of the gate drive 220a, the waveform at 223 showing a step function rising from −15V (or default voltage) to +15V. This output waveform 304 is same as the reference waveform the measurement is compared against; and confirms that the A+ switch transistor is in good working condition. The single pulse test can then be conducted in turn to other electronic components in the diagram 200.

Returning to FIG. 2, the inductors 225a and 225b can be connected with current sensors 230 and 240 respectively for measuring the current passing therein. In some implementations, a third current sensor may be connected with the inductor 225c. The measured current can be summed to compare against an expected value (e.g., zero) for determining if there is ground leak in the circuit. Further examples are shown in FIG. 4.

Figure 4:
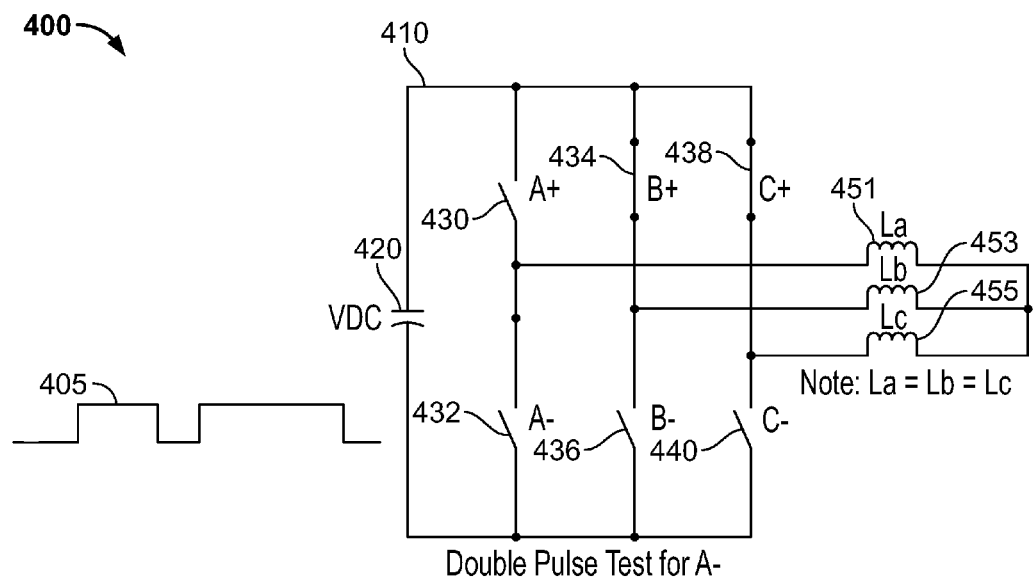
FIG. 4 illustrates an example double pulse test with switch indicators and input waveforms applied to the example circuit diagram of FIG. 2.

FIG. 4 illustrates an example double pulse test with switch indicators and input waveforms applied to the example circuit diagram 200 of FIG. 2. FIG. 4 includes a further simplified diagram 400 of the gate drive portion the diagram 200. The diagram 400 includes an example input waveform 405 and an example circuit 410. In particular, the switch transistors A+, A−, B+, B−, C+, and C− are respectively illustrated in the diagram 400 as switch transistors 430, 432, 434, 436, 438, and 440. The capacitor bank 420 becomes a power source in the diagram 400, providing DC power. The inductors are also illustrated in the diagram 400, as La 451, Lb 453, and Lc 455, respectively representing the inductors 225a, 225b, and 225c of FIG. 2. The setup of diagram 400 is for a double pulse test in which two consecutive pulses are applied to the switch transistors. The two consecutive pulses are shown as the step function waveform 405. The consecutive pulses are applied to one switch transistor while the other two complementary switch transistors of the respective phases are held "on." For example, as shown in FIG. 4, the A_L is pulsed while B_H and C_H are held "on" during the test time. Because the other two switch transistors are "on," the total inductance of La, Lb, and Lc is equivalent to 1.5 La, assuming La, Lb, and Lc have the same inductance value. More generally, with the shorted three phases' inductors (e.g., in case of having a motor connected and the inductor has the inductance of reactor and motor phase inductor lining in series), the equivalent total inductance is equal to 1.5 times of the single phase inductance.

In a double pulse test, the double pulse waveform 405 can be applied to A_L. The current in A− will linearly increase during the first pulse, at the rate of VDC/L, where VDC is the voltage of the capacitor 420 and L is the inductance of a single phase. Then the current in A− decays slowly during the off period between the two pulses. At the second pulse, the current in A− rises again at the same rate VDC/L. The DSP control board 210 monitors the changes, and therefore the switching characteristics of the switch transistors. With the current sensors such as the sensors 230 and 240 of FIG. 2 to measure current through the inductors 225*a* and 225*b* respectively, current waveforms can be further analyzed for correct timing, amplitude level, as well as other parameters, based on known values of inductors, capacitors, and the provided VDC. For example, the double pulse test may be set up in a similar manner as the single pulse test. Four input variables (e.g., indicating time) can be written to initiate the double pulse test. In general, the initiation of the double pulse test may be set by inputting a first variable "yy" into command register. Then X3 can be set in one assigned address as the length of the first pulse. X2 can be set in another assigned address to express the length of the off period between the first and the second pulse. And another variable X1 can be set in another assigned address to express the length of the second pulse.

During operation, DC power is supplied to and stored at the capacitor bank 420. As illustrated in FIG. 1, the DC power may be directly supplied from a DC power source (e.g., the transformer 113) or from a rectifier such as the front end active rectifier 130. Then a series of command register numbers can be written to each switch transistor. For example, command register number 20 can be written for the switch transistor 430 (A+), and 17 can be written for the switch transistor 432 (A−). Command register number 21 can be written for the switch transistor 434 (B+) and 18 for the switch transistor 436 (B−). Command register number 22 can be written for the switch transistor 438 (C+) and 19 for the switch transistor 440 (C−). An example test and test results are shown in FIG. 5.

Figure 5:
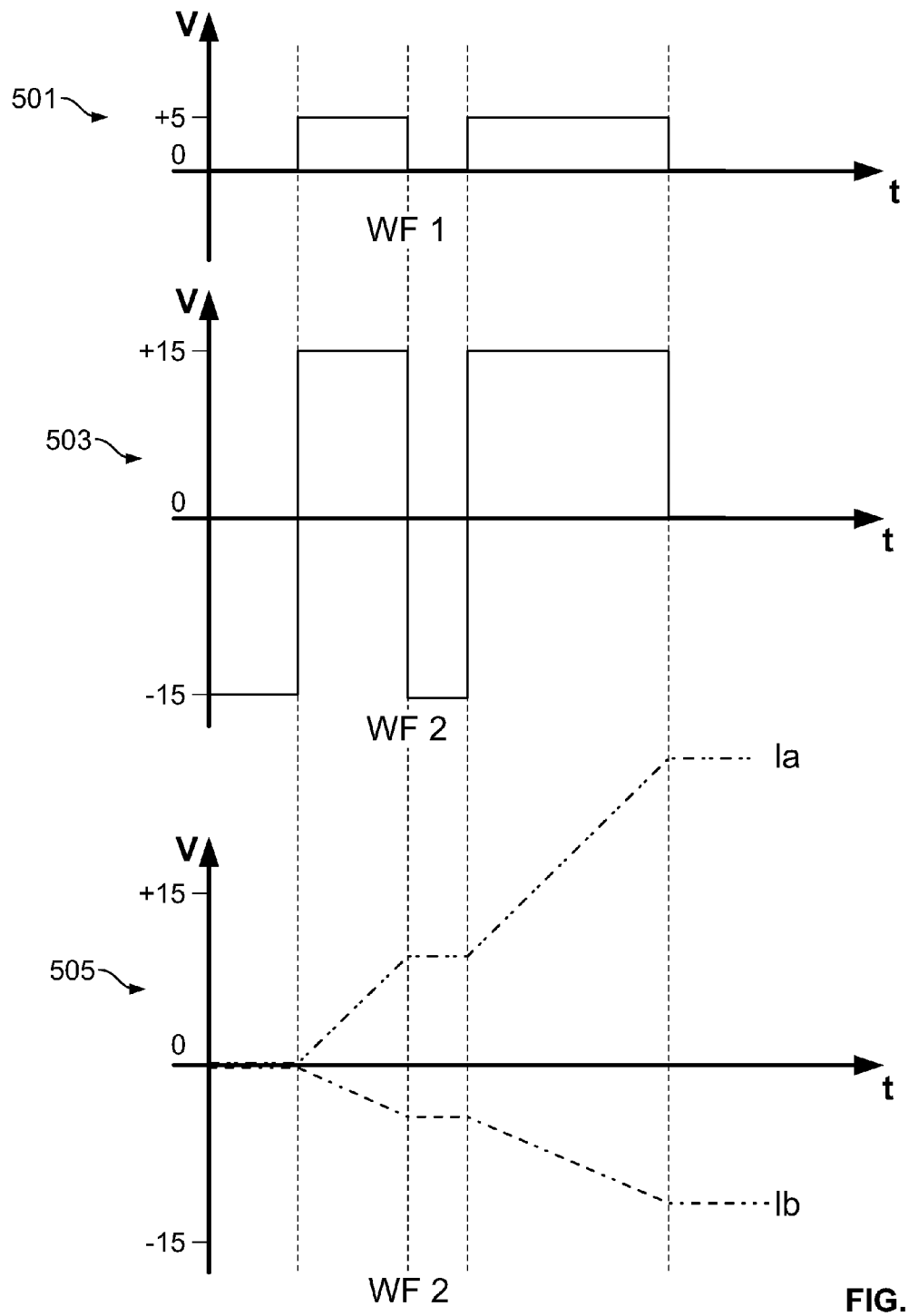
FIG. 5 illustrates an example double pulse test with input and output waveforms.

FIG. 5 illustrates an example double pulse test with an input waveform 501 and two output waveforms 503 and 505. The input waveform 501 includes a step function having two pulses rising from 0 to 5 V. The first output waveform 503 is measured at the A+ switch transistor 430, showing a step function having two pulses in correspondence to the input waveform. The second output waveform 505 illustrates the current running through the inductors La 451 and Lb 453. The slope or gradient of the current variation reacting to the double pulse voltage signals can be used to characterize the status of the switch transistor as well as overall connection status of the power electronic device. The waveforms 503 and 505 can be compared with standard or reference waveforms for determining if the switch transistors 430, 432, 434, 436, 438, and 440, as well as other components, are in good operation conditions.

Figure 6:
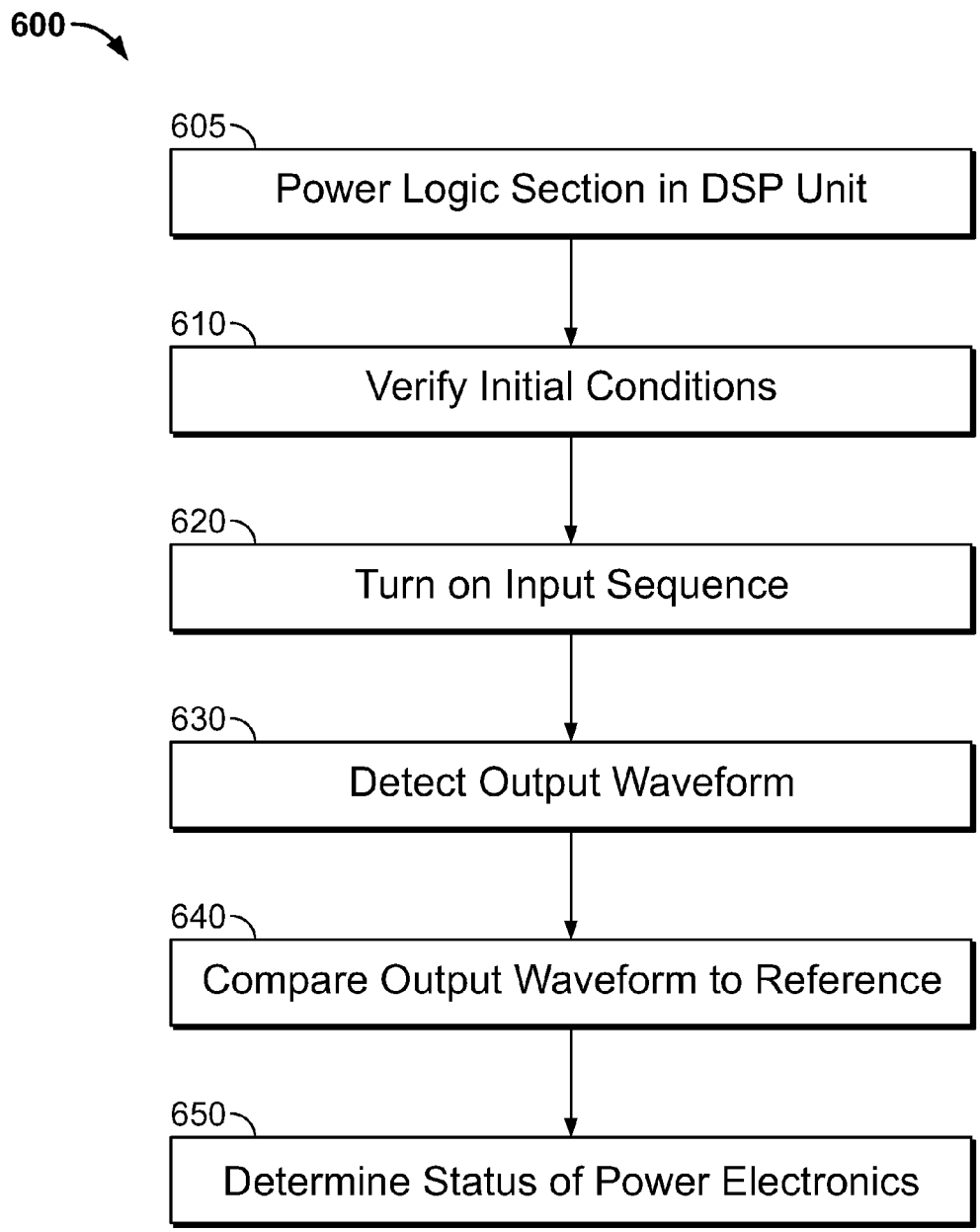
FIG. 6 is a flow chart illustrating methods for performing diagnostic tests to a power electronic device and an electric machine coupled therewith.

FIG. 6 is a flow chart 600 illustrating methods for performing diagnostic tests to a power electronic device and an electric machine coupled therewith. At 605, a logic section in a DSP unit of the power electronic device is powered up for test initiation. In some implementations, the power electronic device can include a capacitor bank to receive DC power from a rectifier or a transformer or other DC power sources. The DC power at the capacitor bank can be used to initialize the logic section in the DSP unit.

At 610, initial conditions are verified. The initial condition verification can include verifying an initial set of communication logic signals to be zero and verifying an initial set of gate signals is at a default level (such as −15V, as illustrated in FIG. 1). The initial set of gate signals can be measured at an output of a gate driver board.

At 620, the switch transistors are turned on in a particular input sequence using a specific input waveform. The input waveform or sequence is controlled at the DSP unit. The DSP unit can command the switch transistors between on and off status to form a test circuit to generate specific output waveform. In some implementations, the input waveform can include a single pulse step function, a double pulse step function, and other types of waveforms.

At 630, the output waveform is detected using voltage, current, and other types of sensors to send measurement signals to the DSP unit. In some implementations, the DSP unit can integrate with various sensors to receive the output waveform. In some implementations, the sensors may separately be attached or installed to any component under measurement. For example, a voltage sensor may be used to measure the voltage output waveform from a gate driver board associated with the switch transistor being measured.

At 640, the output waveform is compared to a reference or standard waveform. The comparison analysis can examine the power electronic device for wiring issues as well as component status. The reference or standard waveform may be the first test result recorded when all components have been confirmed to operate in normal conditions. Changes in the output waveforms can then reflect wear, aging, or damage to the components. A predefined error range may be used to set a criteria for determining if the change of the output waveform from the reference waveform can qualify as an error.

At 650, based on the comparison of the output waveform against the reference waveform, the status of the power electronic device can be determined (e.g., identifying errors that require correction, or confirming a satisfactory operational condition). The DSP unit can store the test results locally or communicate the results to a network server. In some implementations, the types of the tests, frequency of the tests, and parameters of the tests may be set on demand or as regular examination. If errors are identified, the DSP unit may be programmed to temporarily disable the power electronic device and alert signals may be sent to related information systems to require maintenance.

The present disclosure describes embodiments of a single or a double pulse test performed using a DSP unit. Other embodiments and advantages are recognizable by those of skill in the art by the forgoing description and the claims.

What is claimed is:

1. A power electronic device electrically coupled to an electric machine installed at an operational site, the power electronic device comprising a digital signal processing (DSP) unit configured to:
   power a logic section in the DSP unit of the power electronic device;
   verify that an initial set of communication logic signals in the logic section is zero;
   verify that an initial set of gate signals is at a first predetermined level, the initial set of gate signals being measured at an output of a gate driver board;
   activate, in response to the verification that the initial set of communication logic signals is zero and the initial set of gate signals is at the first predetermined level, a plurality of electronic switches in a predetermined sequence to update the initial set of communication logic signals to a second set of communication logic signals in the DSP unit of the power electronic device;
detect a voltage waveform at the output of the gate driver board; and
determine a status of the power electronic device by comparing the voltage waveform against a reference voltage waveform.

2. The power electronic device of claim 1, wherein the predetermined sequence comprises a step function including a single pulse.

3. The power electronic device of claim 2, wherein the voltage waveform comprises a corresponding step function including a single pulse, the corresponding step function matching the reference voltage waveform for determining the status of the power electronic device being operational.

4. The power electronic device of claim 1, wherein the predetermined sequence comprises a second step function including two pulses.

5. The power electronic device of claim 4, wherein the voltage waveform in correspondence to the predetermined sequence identifies changes in electronic component parameters of the power electronic device.

6. The power electronic device of claim 1, further comprising at least one of:
a capacitor bank for stably storing a direct current power source;
a pre-charge section connecting to a power grid via a fuse, the pre-charge section charging the capacitor bank using power from the power grid;
a front end active rectifier for converting an alternating current power source to a direct current power source; and
an electric machine inverter for converting the direct current power source to an alternating current power source.

7. The power electronic device of claim 6, further comprising at least one of:
a grid side reactor for improving total harmonic distortion; and
a machine side reactor for improving total harmonic distortion.

8. The power electronic device of claim 6, wherein the front end active rectifier is connected with the electric machine producing alternating current power and converting the alternating current power to a direct current power.

9. The power electronic device of claim 6, wherein the electric machine inverter uses the direct current power source in the capacitor bank to power the electric machine with alternating current.

10. The power electronic device of claim 1, further comprising a DSP unit configured to:
detect a current waveform at the output of the gate driver board; and
determine a status of the power electronic device by comparing the current waveform against a reference current waveform.

11. The power electronic device of claim 10, wherein the current waveform comprises at least two current signals of inductors connected to the electric machine, the at least two current signals complying with Kirchhoff current law.

12. The power electronic device of claim 11, wherein the current waveform contradicting to the at least two current signals complying with Kirchhoff current law indicates a fault in the power electronic device.

13. A method performed by a DSP unit for examining a status of a power electronic device electrically coupled to an electric machine installed at an operational site, the method comprising:

powering a logic section in the DSP unit of the power electronic device;
verifying that an initial set of communication logic signals in the logic section is zero;
verifying that an initial set of gate signals is at a first predetermined level, the initial set of gate signals being measured at an output of a gate driver board;
activating, in response to the verification that the initial set of communication logic signals is zero and the initial set of gate signals is at the first predetermined level, a plurality of electronic switches in a predetermined sequence to update the initial set of communication logic signals to a second set of communication logic signals in the DSP unit of the power electronic device;
detecting a waveform at the output of the gate driver board; and
determining a status of the power electronic device by comparing the waveform against a reference waveform.

14. The method of claim 13, wherein predetermined sequence comprises a step function including a single pulse.

15. The method of claim 14, wherein the waveform comprises a corresponding step function including a single pulse, the corresponding step function matching the reference waveform for determining the status of the power electronic device being operational.

16. The method of claim 13, wherein the predetermined sequence comprises a second step function including two pulses.

17. The method of claim 16, wherein the waveform in correspondence to the predetermined sequence identifies changes in electronic component parameters of the power electronic device.

18. An electric machine system comprising:
a stator;
a rotor having a rotational axis configured to move relative to the stator;
a power electronic device for powering the electric machine system, comprising:
a capacitor bank for stably storing a direct current power source;
a pre-charge section connecting to a power grid via a fuse, the pre-charge section charging the capacitor bank using power from the power grid;
a front end active rectifier for converting an alternating current power source to a direct current power;
an electric machine inverter for converting the direct current power source to an alternating current power source; and
a DSP unit configured to:
power a logic section in the DSP unit of the power electronic device;
verify that an initial set of communication logic signals in the logic section is zero;
verify that an initial set of gate signals is at a first predetermined level, the initial set of gate signals being measured at an output of a gate driver board;
activate, in response to the verification that the initial set of communication logic signals is zero and the initial set of gate signals is at the first predetermined level, a plurality of electronic switches in a predetermined sequence to update the initial set of communication logic signals to a second set of communication logic signals in the DSP unit of the power electronic device;
detect a waveform at the output of the gate driver board; and determine a status of the power electronic device by comparing the waveform against a reference waveform.

19. The electric machine system of claim 18, wherein the predetermined sequence comprises a step function including a single pulse.

20. The electric machine system of claim 19, wherein the waveform comprises a corresponding step function including a single pulse, the corresponding step function matching the reference waveform for determining the status of the power electronic device being operational.

21. The electric machine system of claim 18 wherein the predetermined sequence comprises a second step function including two pulses.

22. The electric machine system of claim 21 wherein the waveform in correspondence to the predetermined sequence identifies changes in electronic component parameters of the power electronic device.

\* \* \* \* \*